US008223347B2

(12) United States Patent
Smilde et al.

(10) Patent No.: US 8,223,347 B2
(45) Date of Patent: Jul. 17, 2012

(54) INSPECTION METHOD AND APPARATUS, LITHOGRAPHIC APPARATUS, LITHOGRAPHIC PROCESSING CELL AND DEVICE MANUFACTURING METHOD

(75) Inventors: Hendrik Jan Hidde Smilde, Veldhoven (NL); Willem Marie Julia Marcel Coene, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 148 days.

(21) Appl. No.: 12/822,422

(22) Filed: Jun. 24, 2010

(65) Prior Publication Data
US 2011/0001978 A1    Jan. 6, 2011

Related U.S. Application Data

(60) Provisional application No. 61/223,217, filed on Jul. 6, 2009.

(51) Int. Cl.
*G01N 21/47* (2006.01)
*G01B 11/00* (2006.01)

(52) U.S. Cl. .................. 356/614; 356/445; 356/399

(58) Field of Classification Search ......... 356/601–625, 356/392, 394, 237.3, 237.4, 445, 399–401; 250/559.07, 559.02, 559.39, 559.49
See application file for complete search history.

(56) References Cited

U.S. PATENT DOCUMENTS

| 7,061,615 | B1 | 6/2006 | Lowe-Webb |
| 7,148,959 | B2* | 12/2006 | Dusa et al. ................. 356/237.4 |
| 7,352,453 | B2* | 4/2008 | Mieher et al. ................. 356/125 |
| 7,564,555 | B2* | 7/2009 | Den Boef et al. ............. 356/401 |
| 7,580,131 | B2* | 8/2009 | Den Boef ...................... 356/446 |
| 7,738,103 | B2* | 6/2010 | Kiers et al. .................... 356/392 |
| 7,916,284 | B2* | 3/2011 | Dusa et al. ..................... 356/124 |
| 7,992,115 | B2* | 8/2011 | Van Der Heijden et al. . 716/111 |
| 2004/0070772 | A1 | 4/2004 | Shchegrov et al. |
| 2004/0169861 | A1 | 9/2004 | Mieher et al. |
| 2005/0185174 | A1 | 8/2005 | Laan et al. |
| 2005/0195398 | A1* | 9/2005 | Adel et al. ..................... 356/401 |
| 2006/0066855 | A1 | 3/2006 | Boef et al. |
| 2010/0265506 | A1* | 10/2010 | Den Boef ....................... 356/399 |

FOREIGN PATENT DOCUMENTS

EP 1628164 A2 2/2006

OTHER PUBLICATIONS

International Search Report for International Application No. PCT/EP2010/058844 mailed Oct. 25, 2010, 11 pages.

* cited by examiner

*Primary Examiner* — Sang Nguyen
(74) *Attorney, Agent, or Firm* — Sterne, Kessler, Goldstein & Fox P.L.L.C.

(57) ABSTRACT

A method of determining an overlay error between two successive layers produced by a lithographic process on a substrate, including using the lithographic process to form a calibration structure including a periodic structure of the same pitch on each of the layers, such that an overlaid pair of periodic structures is formed, the structures being parallel, but offset relative to each other by an overlay amount. A spectrum produced by directing a beam of radiation onto the calibration structure is measured and compared with one or more modeled spectra so as to determine values of the grating parameters for the calibration structure from the measured spectrum. The lithographic process is used to form further overlaid periodic structures on the same or one or more subsequent substrates, the determined grating parameter values for the calibration structure being used to determine overlay amounts for the further overlaid periodic structures.

7 Claims, 5 Drawing Sheets

INSPECTION METHOD AND APPARATUS, LITHOGRAPHIC APPARATUS, LITHOGRAPHIC PROCESSING CELL AND DEVICE MANUFACTURING METHOD

CROSS REFERENCE TO RELATED APPLICATION

This application claims priority under 35 U.S.C. §119(e) to U.S. Provisional Patent Application No. 61/223,217, filed Jul. 6, 2009, which is incorporated by reference herein in its entirety.

BACKGROUND

1. Field of the Invention

The present invention relates to methods of inspection usable, for example, in the manufacture of devices by lithographic techniques and to methods of manufacturing devices using lithographic techniques. The invention has particular relevance to methods of determining overlay errors between successive layers formed using lithographic techniques.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

SUMMARY

It is desirable to provide a method of determining overlay errors between two successive layers produced by lithographic process on a substrate wherein these problems may be avoided.

According to a first embodiment of the invention, there is provided a method of determining an overlay error between two successive layers produced by a lithographic process on a substrate, the method comprising the following steps. Using the lithographic process to form a calibration structure comprising two periodic structures of the same pitch on each of the layers, such that an overlaid pair of periodic structures is formed, the periodic structures being parallel, but offset relative to each other by an overlay amount. Measuring a spectrum produced by directing a beam of radiation onto the calibration structure. Comparing the measured spectrum with one or more modeled spectra so as to determine values of the grating parameters for the calibration structure from the measured spectrum. Using the lithographic process to form further overlaid periodic structures on the same or on one or more subsequent substrates. Using the determined grating parameter values for the calibration structure to determine overlay amounts for the further overlaid periodic structures.

According to a second embodiment of the invention, there is provided an angularly resolved scatterometer configured to determine an overlay error between two successive layers produced by a lithographic apparatus on a substrate, wherein the lithographic apparatus has been used to form a calibration structure comprising two periodic structures of the same pitch on each of the layers, such that an overlaid pair of periodic structures are formed which are parallel, but are offset relative to each other, the scatterometer comprising the following elements. A detector configured to detect a spectrum produced by directing a beam of radiation onto the calibration structure. A comparison arrangement configured to compare the measured spectrum with one or more modeled spectra so as to determine values of the grating parameters for the calibration structure from the measured spectrum. A determination arrangement configured to use the determined grating parameter values for the calibration structure to determine overlay amounts for the further overlaid periodic structures produced by the lithographic apparatus on the same or one or more further substrates.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 9 depicts a pupil plane in which there is constant offset error between the two periodic layers as measured over the pupil plane, in which the variation in asymmetry as a function of the position in the pupil plane has been corrected for.

Figure 1:
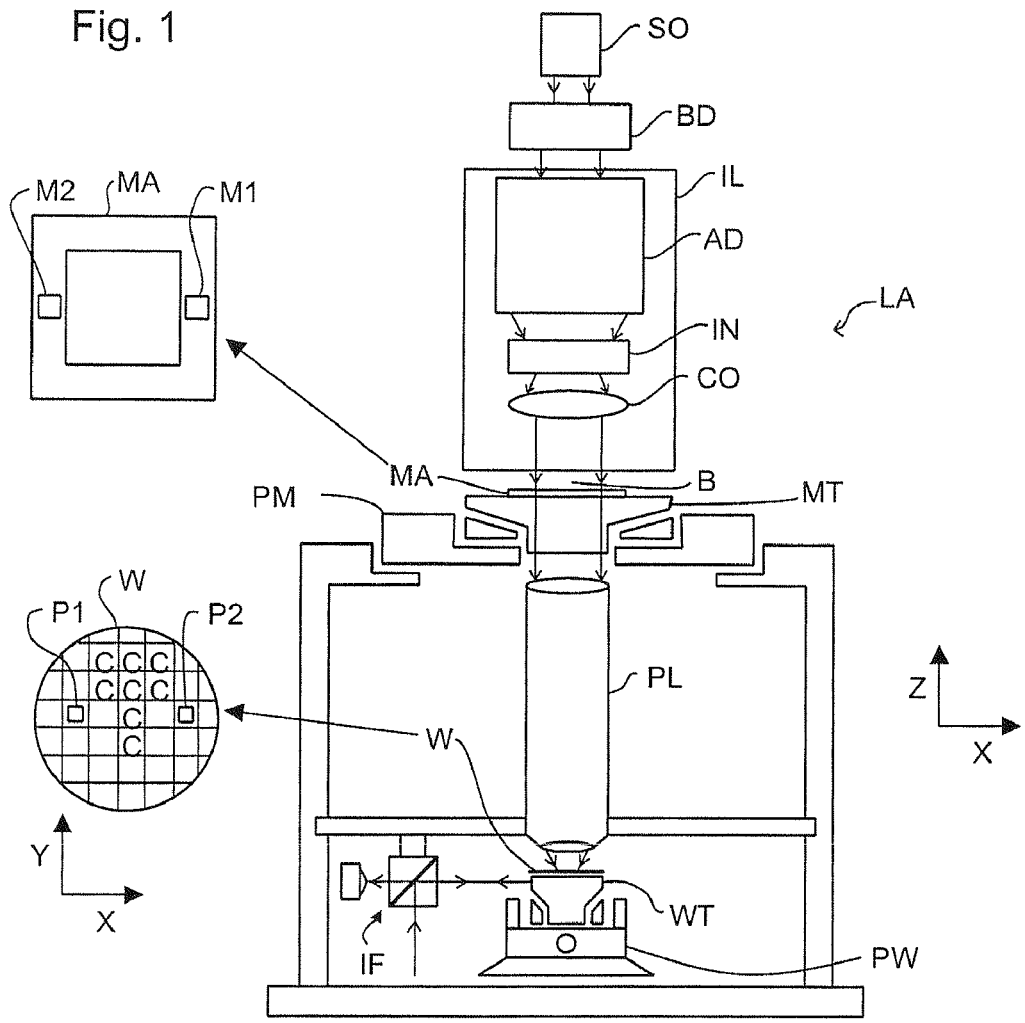
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus. The apparatus comprises an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
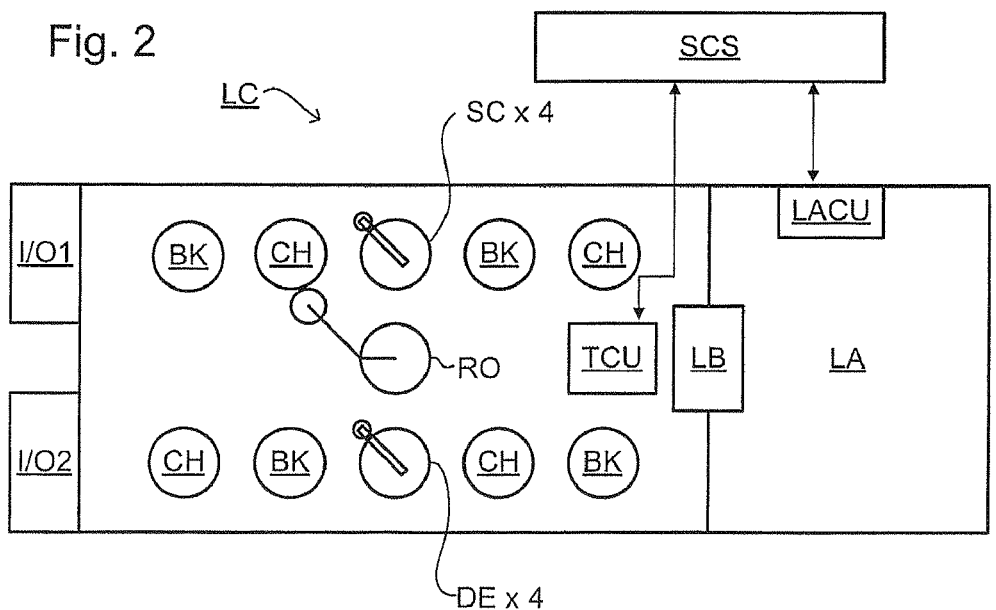
FIG. 2 depicts a lithographic cell or cluster.

As shown in FIG. 2, the lithographic apparatus LA forms part of a lithographic cell LC, also sometimes referred to a lithocell or cluster, which also includes apparatus to perforin pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist, which have been exposed to radiation, and those which have not—and not all inspection apparatus have sufficient sensitivity to make useful measurements of the latent image. Therefore measurements may be taken after the post-exposure bake step (PEB), which is customarily the first step, carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
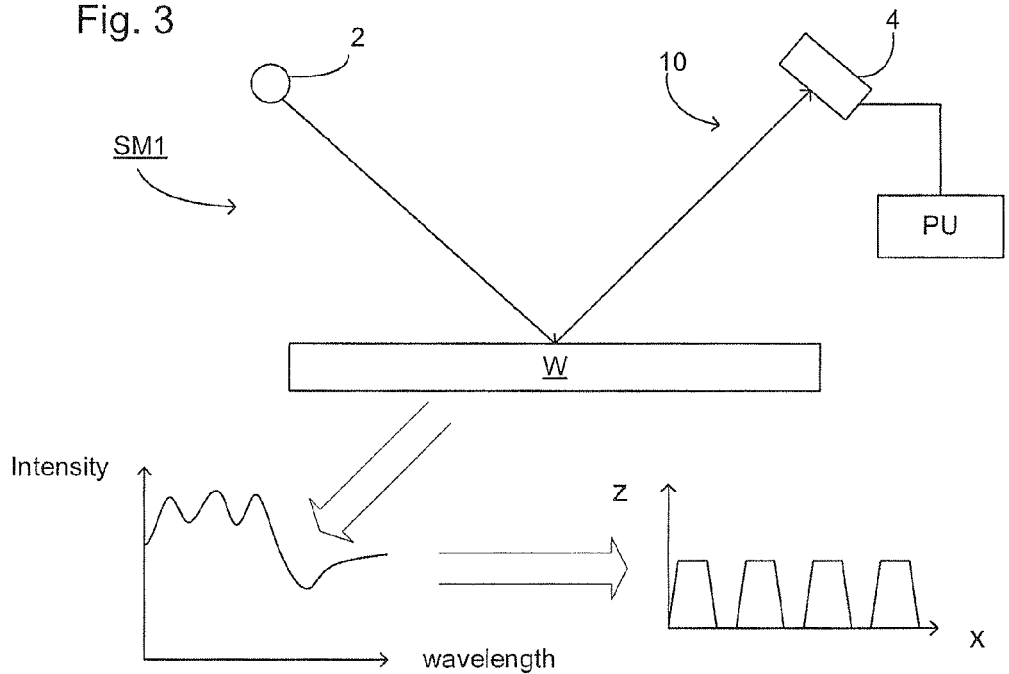
FIG. 3 depicts a first scatterometer.

FIG. 3 depicts a scatterometer SM1 that may be used in the present invention. It comprises a broadband (white light) radiation projector 2, which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
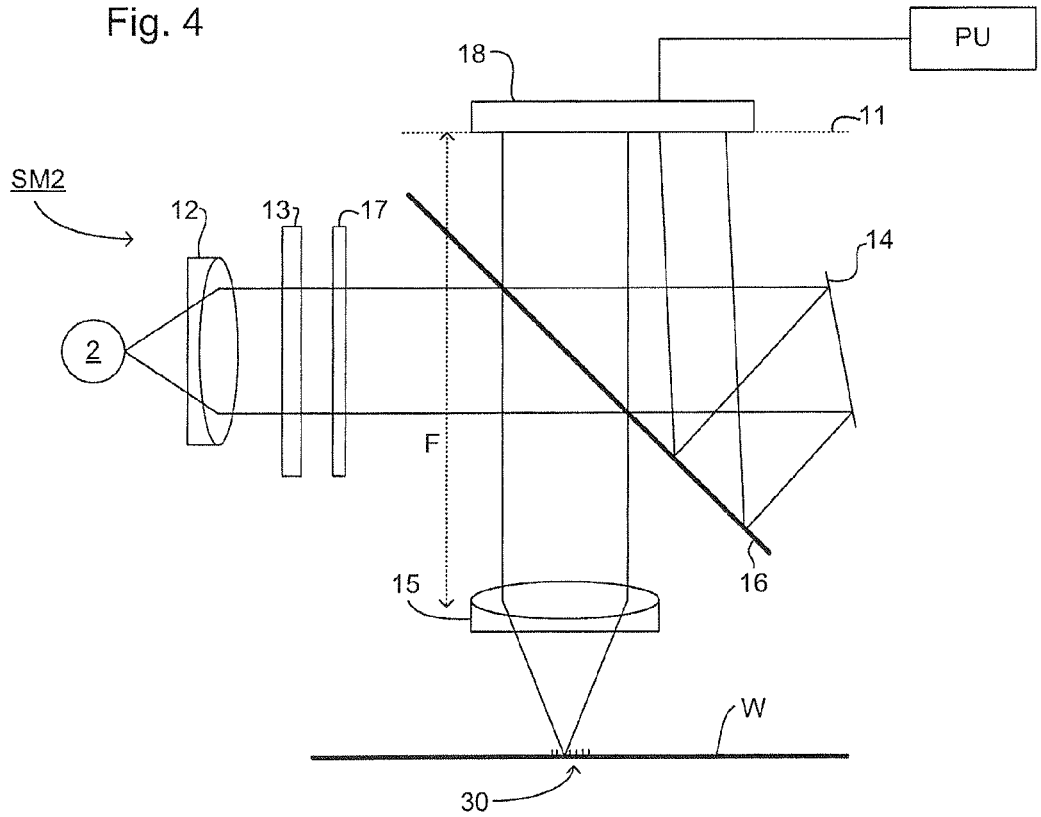
FIG. 4 depicts a second scatterometer.

Another scatterometer SM2 that may be used with the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference minor 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta 8$ and a spacing of at least $2\Delta 8$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in E.P. 1,628,164A, which is incorporated by reference herein in its entirety.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

There will now be described methods of measuring overlay errors in accordance with embodiments of the present invention, in which the effect of the variation in the derived values of overlay errors derived from measurements of asymmetry over the pupil plane may be reduced, by reconstructing a measured spectrum from a grating structure at a particular location on the substrate to determine the parameters of the particular grating structure and reusing the determined grating structure parameters in further reconstructions to derive values for the overlay error over the pupil plane. The detailed reconstructed model of the stack may then be used in forward spectra calculation using either a library approach, or an asymmetry or overlay approach) or 1-parameter (overlay) reconstruction to eliminate measured variations over the pupil plane due to model-errors in the asymmetry against overlay relation in measurements of subsequent grating structures at the same or further substrates.

In order to measure the overlay error between two successive layers on the substrate, it is known to provide the two layers with respective gratings or periodic structures. Any overlay errors between the two gratings can be measured from the asymmetry in the reflected spectrum, that is variations in the measured intensity of the reflected spectrum for the +/−1 diffraction orders. The relationship between the measured intensity and the overlay error can be calibrated using two pairs of overlaid gratings, one grating on a first layer being shifted relative to the corresponding grating on the other layer in one direction, whilst the other grating on the first layer is shifted relative to the corresponding grating on the other layer in the opposite direction. This technique is disclosed in the applicant's earlier application U.S. Published Patent Application No. 2006/0066855, the contents of which are incorporated herein by reference. The measured intensity of the reflected spectrum varies periodically with the offset between the gratings in each pair of gratings on the two layers, the period being equal to the grating pitch of the two gratings.

It has been found to be generally satisfactory to use a linear relationship between the intensity variation between the +/−1 order diffracted spectra and the overlay error, where there are only small overlay errors. A better approximation is to assume a sinusoidal relationship as disclosed in U.S. Published Patent Application No. 2006/0066855, which is incorporated by reference herein in its entirety. However, with either a linear or a sinusoidal approximation, the obtained overlay error values vary systematically over the pupil plane of the measured reflected spectrum, being dependent on the angle of incidence and the azimuth angle of the radiation beam. Furthermore the value of the overlay error is often dependent on the measurement parameters that are used in the scatterometer, such as the wavelength, illumination aperture and the polarization of the radiation beam. In other words the variation over the pupil plane does not only result from random noise. Such variations over the pupil plane hampers correct evaluations of the overlay error, hampers selection of the optimum recipe for the overlay measurement (based on, for example, the best signal-to-noise (S/N) ratio) and leads to errors in the optimization of subsequent lithographic processing parameters.

Figure 5:
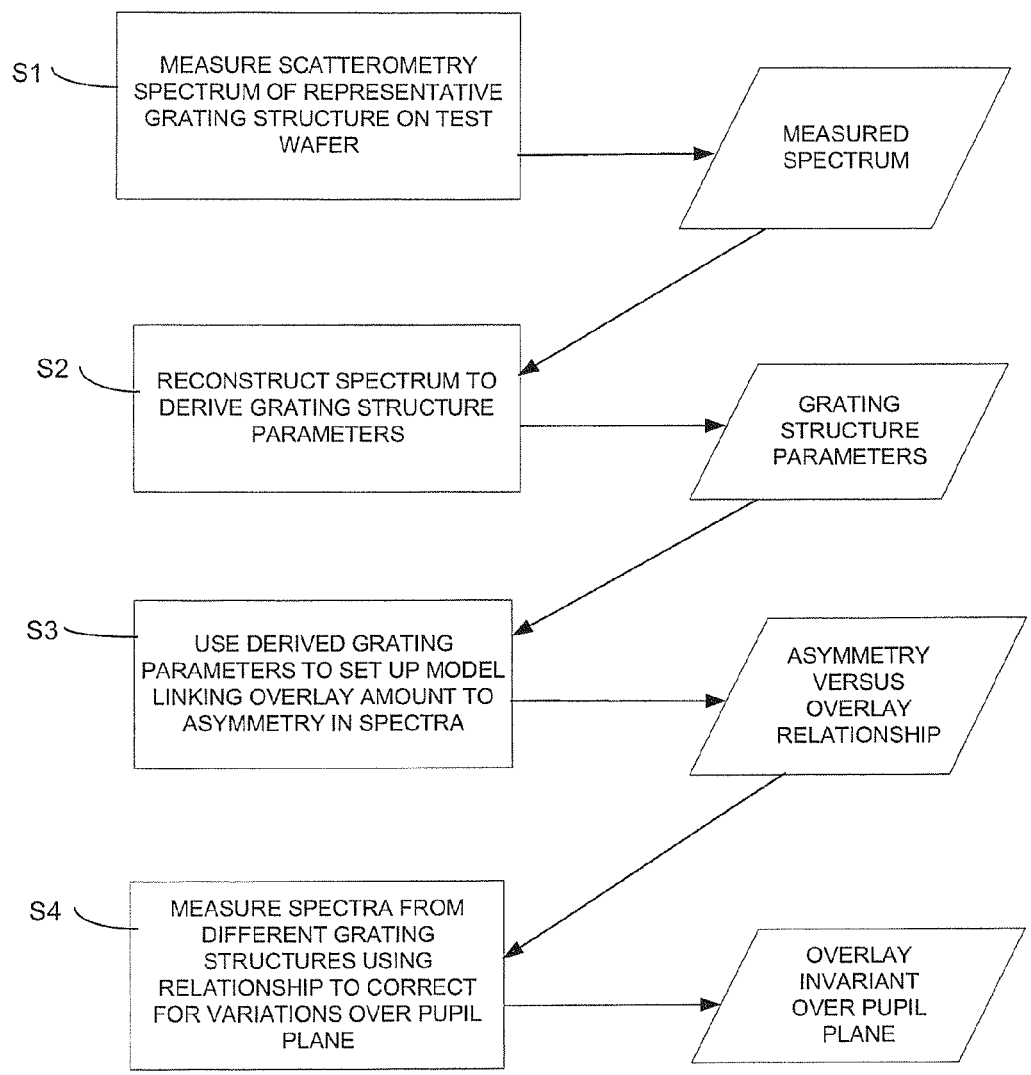
FIG. 5 depicts the steps of a method of determining an overlay error in accordance with a first embodiment of the present invention.

Referring now to FIG. 5, this figure illustrates the steps of a method in accordance with a first embodiment of the present invention. In step S1 a scatterometry measurement is made of a representative substrate W on which has been formed a calibration grating structure comprising a pair of overlaid gratings, the gratings being offset from each other in the direction parallel to the length of the gratings. The calibration grating structure will usually be positioned in a scribe-line, suitable illumination settings, including wavelengths and polarization, being provided for the scatterometer radiation beam to enable the reconstruction of the measured spectra.

Figure 6:
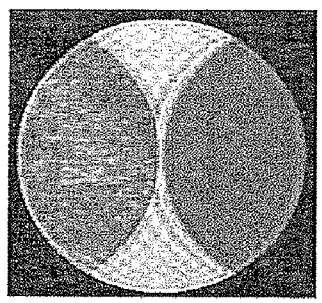
FIG. 6 depicts the measured pupil plane of a scatterometer using a method in accordance with the first embodiment.

The result of the measurement, is a pupil plane including a diffraction pattern, typically of the form illustrated in FIG. 6, measured with full open aperture, that is the numerical aperture NA is between zero and the objective lens maximum, although the form of the beam may be chosen such that only the strongest +/−$1^{st}$ order diffracted beams are selected, this part of the spectrum usually being most sensitive to overlay.

Figure 7:
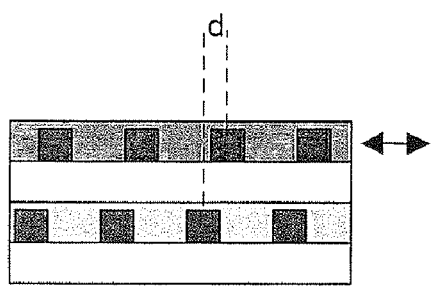
FIG. 7 depicts the overlay error between two gratings formed on successive layers formed on a substrate.

In step S2, the measured spectrum is reconstructed to derive the values of the grating structure producing the measured spectrum. This may be done in known manner using a technique as used in critical dimension (CD) metrology, which uses a modeling technique based on Maxwell's equations, for example Rigorous Coupled Wave Analysis (RCWA), Volume Integral Method (VIM), or Finite Element Method (FEM). In these techniques, a series of modeled spectra, calculated using particular grating structure parameters, such as grating height and layer thicknesses, and in this application as well as the overlay offsets for each pair of overlaid gratings, are compared with the measured spectrum. The best match with the modeled spectra enables the values of the various parameters to be derived for the measured spectra. The result of this procedure is a derived grating structure model, as illustrated in FIG. 7, in which values for the thickness of the underlying coatings 71, 72 may be established, as well as the heights of the gratings 73,74 and the side wall angles (SWA s) of the gratings 73,74. The overlay offset d between the two gratings may also be derived.

Figure 8:
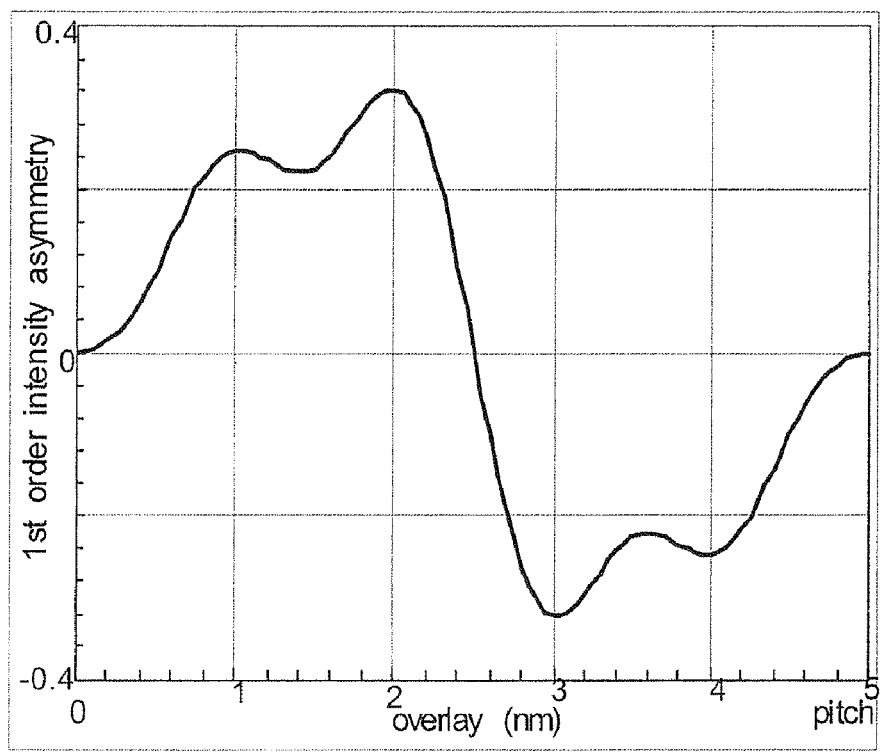
FIG. 8 illustrates the difference between the intensities of the +/− first order patterns as a function of the overlay error between the two periodic structures shown in FIG. 7.

In step S3, the grating structure model is used to set up a library of values of the relationship between the measured asymmetry in the reflected spectrum, that is variations in the measured intensity of the reflected spectrum for the +/−$1^{st}$ order diffraction pattern and the offset. This is achieved by using the derived model to yield values for the asymmetry as the overlay is varied, whilst maintaining the values of the layer and grating thicknesses etc as derived in step S2. This procedure will yield the desired relationship between the overlay and the first order intensities of their asymmetry for each position in the measured pupil plane shown in FIG. 6. However, as the values of the parameters such as the layer and grating thicknesses etc are kept constant, the amount of computation required will be vastly reduced compared to a model based overlay (MBOV) procedure in which a complete reconstruction is used for each grating structure, with the overlay between the gratings being added to the usual grating parameters. The result of the procedure in S3 will be the plot of the first order intensity asymmetry against overlay as shown in FIG. 8 for each position in the pupil plane, this being conveniently stored in the faun of a lookup table. The relation between the intensity of the first order diffraction pattern and the overlay will be specific for each combination of layers materials and process if related effects for each grating structure. Thus the procedure must be performed experimentally for each different wafer in particular at several different positions on the wafer dependent on the sensitivity of the overlay on these parameters and variations over the wafer.

The output of step S3 may for example consist of the coefficients $K_n$, $L_n$ of a pitch periodic function such as $$\Delta I_{\pm 1}(OV) = \sum_n K_n \cdot \sin\left(\frac{2\pi \cdot n}{\text{pitch}} OV\right) + L_n \cos\left(\frac{2\pi \cdot n}{\text{pitch}} OV\right)$$

where OV is the overlay value. Alternatively the output of step S3 may consist of the coefficients $a_n$ of other fits to the results, such as a polynomial function.

This relation must be determined for each position in the pupil plane that is each particular angle of reflection $$OV(\Delta I_{\pm 1}) = \sum_n a_n \cdot (\Delta I_{\pm 1} - const.)^n$$

Figure 9:
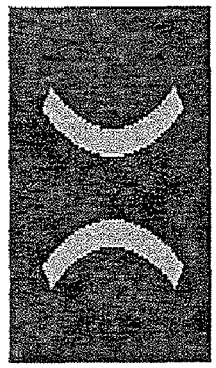

In step S4, other grating structures, either grating structures positioned at other points on the same substrate W, or subsequent grating structures formed on subsequent substrate processed by the lithography apparatus using the same settings as for the initial substrate W, may be measured. Again, these grating structures may be positioned in the scribe lines or in-die. From the asymmetry measurements, the overlay may be calculated using the correlation between the asymmetry measurement and the overlay measurement shown in FIG. 8, to produce overlay measurements that are constant over the measured pupil plane as indicated in FIG. 9.

It will be appreciated that the derivation of the optimized grating structure parameters in step S2 can be performed in various ways. The optimization of the parameters may be performed on the smallest statistical variations in the overlay measurements including the difference between the model and the measured spectra for the pupil plane (static precision). Alternatively, the optimization may be based on physical considerations involving a wafer-specific model, the overlay range and illumination parameters. For example, the intensity and intensity modulation of the illumination may be optimized for the overlay range to give maximum sensitivity.

It will be appreciated that in the embodiment described above, the derived grating parameters are fixed in the reconstructions used for subsequent grating structures, with the overlay value as the only floating parameter. However there are further possibilities for reusing the derived grating model described above, as will now be described.

Figure 10:
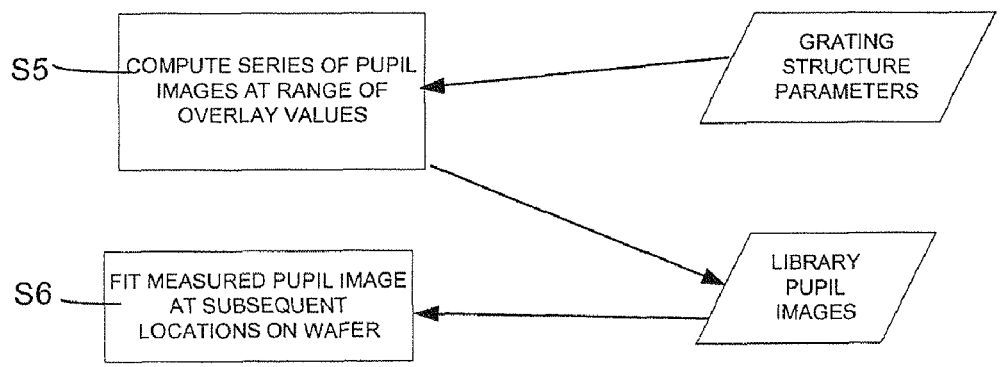
FIG. 10 depicts the steps of determining an overlay error in a method in accordance with a second embodiment of the present invention.

Turning now to FIG. 10, in the second embodiment to be described, the grating structure parameters derived as in steps S1 and S2 of the first embodiment, are used in step S5 to compute a library of spectra at a range of overlay values.

In step S6, the library of spectra may be used in a comparison procedure, in which further measured pupil images of overlay structures from further locations on the wafer W or on subsequent wafers are compared with the images in the library. This will enable the overlay of the measured spectra to be derived, the only variable within the procedure again being the overlay values.

Figure 11:
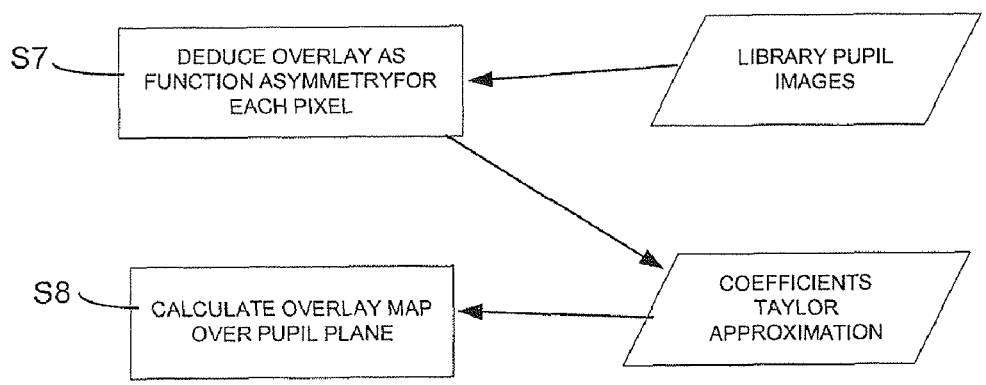
FIG. 11 depicts the steps of determining an overlay error in a method in accordance with a third embodiment of the present invention.

Turning now to FIG. 11, in a third embodiment of the invention, the computed pupil images produced in step S5 of the second embodiment is used in step S7 of the third embodiment to deduce the explicit overlay as a function of the first order asymmetry for each pixel of the pupil plane of the scatterometry diffraction pattern. This may be produced in terms of the coefficients of a Taylor expansion. Alternatively a Fourier series having a pitch as in the pitch periodic function described above, or any other periodic or non-periodic method for fitting the asymmetry versus overlay relation can be used. With a knowledge of each pupil point specific and stack specific relationships, the distribution of the values of the overlay as a function of the first order asymmetry over the pupil plane can be calculated in step S8.

It will be appreciated that by a method in accordance with an embodiment of the invention only statistical variations over the pupil plane will be present in the measurement of the overlay using the asymmetry measurement meaning that systematic of approximate model related variations will be avoided.

It will be also be appreciated that there is a more rapid processing with respect to an MBOV procedure in which all the parameters are used in the reconstruction. Furthermore, in common with such an MBOV procedure, only one unbiased overlay grating that only contains overlay shift is sufficient for each overlay measurement, resulting in a reduction of space consumption of 50% compared to the two biased overlay gratings which must be used for the linear or sinusoidal approximated overlay computation as disclosed in U.S. Published Patent Application No. 2006/0066855. Furthermore more accurate determination of the overlay is produced due to the knowledge of the effect of the processing on the grating shape parameters and therefore on the asymmetry versus overlay relation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
    using a lithographic process to form a calibration structure comprising two periodic structures of a same pitch on each of two successive layers of a substrate, such that an overlaid pair of periodic structures is formed, the periodic structures being parallel, but offset relative to each other by an overlay amount;
    measuring a spectrum produced by directing a beam of radiation onto the calibration structure;
    comparing, using a processing unit, the measured spectrum with one or more stored spectra so as to determine values of the grating parameters for the calibration structure from the measured spectrum;
    using the lithographic process to form further overlaid periodic structures on the same or on one or more subsequent substrates;
    using the determined grating parameter values to compute a series of modeled spectra from overlaid periodic structures having a range of overlay amounts;
    measuring one or more further spectra produced by directing a beam of radiation onto the further overlaid periodic structures on the same or one or more subsequent substrates;
    performing a matching process using the computed series of modeled spectra and the one or more further spectra; and
    determining, using the processing unit, overlay amounts via the matching process for the further overlaid periodic structures.

2. The method of claim 1, wherein the lithographic process is used to form overlaid periodic structures on the same or one or more subsequent substrates having substantially the same grating parameters as those of the calibration structure.

3. The method of claim 1, wherein the determining, using the processing unit, comprises
    determining, using the processing unit, overlay values as a function of the asymmetry for each pixel of the spectrum, and
    using the determined overlay values to determine overlay amounts for the further overlay structures.

4. The method of claim 1, wherein asymmetry between the intensities of the +1st and −1st orders of the spectrum are measured.

5. An angularly resolved scatterometer configured to determine an overlay error between two successive layers produced by a lithographic apparatus on a substrate, wherein the lithographic apparatus has been used to form a calibration structure comprising two periodic structures of the same pitch on each of the layers, such that an overlaid pair of periodic structures are formed which are parallel, but are offset relative to each other, the scatterometer comprising:
    a detector configured to detect a spectrum produced by directing a beam of radiation onto the calibration structure; and
    a processing unit configured to:
        compare the measured spectrum with one or more stored spectra so as to determine values of the grating parameters for the calibration structure from the measured spectrum,
        use the determined grating parameter values to compute a series of modeled spectra from overlaid periodic structures having a range of overlay amounts,
        measure one or more further spectra produced by directing a beam of radiation onto further overlaid periodic structures produced by the lithographic apparatus on the same or one or more subsequent substrates,
        perform a matching process using the computed series of modeled spectra and the one or more further spectra, and
    determine overlay amounts via the matching process for the further overlaid periodic structures produced by the lithographic apparatus on the same or one or more further substrates.

6. A lithographic apparatus comprising:
    an illumination optical system arranged to illuminate a pattern;
    a projection optical system arranged to project an image of the pattern on to a substrate; and
    an angularly resolved scatterometer configured to determine an overlay error between two successive layers produced by a lithographic apparatus on a substrate, wherein the lithographic apparatus has been used to form a calibration structure comprising two periodic structures of the same pitch on each of the layers, such that an overlaid pair of periodic structures are formed which are parallel, but are offset relative to each other, the scatterometer comprising:
        a detector configured to detect a spectrum produced by directing a beam of radiation onto the calibration structure; and
        a processing unit configured to:

compare the measured spectrum with one or more stored spectra so as to determine values of the grating parameters for the calibration structure from the measured spectrum, use the determined grating parameter values to compute a series of modeled spectra from overlaid periodic structures having a range of overlay amounts, measure one or more further spectra produced by directing a beam of radiation onto further overlaid periodic structures produced by the lithographic apparatus on the same or one or more subsequent substrates, perform a matching process using the computed series of modeled spectra and the one or more further spectra, and determine overlay amounts via the matching process for the further overlaid periodic structures produced by the lithographic apparatus on the same or one or more further substrates.

7. A lithographic cell comprising:

a coater arranged to coat substrates with a radiation sensitive layer;

a lithographic apparatus arranged to expose images onto the radiation sensitive layer of substrates coated by the coater;

a developer arranged to develop images exposed by the lithographic apparatus; and a scatterometer configured to determine an overlay error between two successive layers produced by a lithographic apparatus on a substrate, wherein the lithographic apparatus has been used to form a calibration structure comprising two periodic structures of the same pitch on each of the layers, such that an overlaid pair of periodic structures are formed which are parallel, but are offset relative to each other, the scatterometer comprising:

a detector configured to detect a spectrum produced by directing a beam of radiation onto the calibration structure; and a processing unit configured to:

compare the measured spectrum with one or more stored spectra so as to determine values of the grating parameters for the calibration structure from the measured spectrum, use the determined grating parameter values to compute a series of modeled spectra from overlaid periodic structures having a range of overlay amounts, measure one or more further spectra produced by directing a beam of radiation onto further overlaid periodic structures produced by the lithographic apparatus on the same or one or more subsequent substrates, perform a matching process using the computed series of modeled spectra and the one or more further spectra, and determine overlay amounts via the matching process for the further overlaid periodic structures produced by the lithographic apparatus on the same or one or more further substrates.

\* \* \* \* \*